US007038484B2

(12) United States Patent
Harada et al.

(10) Patent No.: US 7,038,484 B2
(45) Date of Patent: May 2, 2006

(54) DISPLAY DEVICE

(75) Inventors: Kazuyuki Harada, Ishikawa-gun (JP); Yohei Kimura, Ishikawa-gun (JP); Koji Nakayama, Kanazawa (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 0 days.

(21) Appl. No.: 11/195,821

(22) Filed: Aug. 3, 2005

(65) Prior Publication Data

US 2006/0028417 A1 Feb. 9, 2006

(30) Foreign Application Priority Data

Aug. 6, 2004 (JP) ............................ 2004-231108
Aug. 6, 2004 (JP) ............................ 2004-231109

(51) Int. Cl.
*G01R 31/00* (2006.01)
*G09G 3/36* (2006.01)

(52) U.S. Cl. ........................................ 324/770; 345/87

(58) Field of Classification Search .................... None
See application file for complete search history.

(56) References Cited

U.S. PATENT DOCUMENTS 6,762,735 B1 * 7/2004 Koyama ..................... 345/76

FOREIGN PATENT DOCUMENTS

JP 6-160898 9/1994
JP 2001-13892 1/2001

* cited by examiner

*Primary Examiner*—Vinh Nguyen
*Assistant Examiner*—Russell M. Kobert
(74) *Attorney, Agent, or Firm*—Oblon, Spivak, McClelland, Maier & Neustadt, P.C.

(57) ABSTRACT

A display device includes a first inspection wiring line that is connected to first wiring lines of a first wiring line group and to third wiring lines of a second wiring line group, and a second inspection wiring line that is connected to second wiring lines of the first wiring line group, which neighbor the first wiring lines, and to fourth wiring lines of the second wiring line group, which neighbor the third wiring lines.

12 Claims, 5 Drawing Sheets

| | First inspection signal ↓ | Second inspection signal ↓ | First inspection signal ↓ | Second inspection signal ↓ |
|---|---|---|---|---|
| 52 (21) | ON | | | |
| 53 (22) | | ON | | |
| 52 (33) | | | ON | |
| 53 (34) | | | | ON |

| | First inspection signal ↓ | First inspection signal ↓ | Second inspection signal ↓ | Second inspection signal ↓ |
|---|---|---|---|---|
| 52 (21) | ON | | | |
| 52 (22) | | ON | | |
| 53 (33) | | | ON | |
| 53 (34) | | | | ON |

DISPLAY DEVICE

CROSS-REFERENCE TO RELATED APPLICATIONS

This application is based upon and claims the benefit of priority from prior Japanese Patent Applications No. 2004-231108, filed Aug. 6, 2004; and No. 2004-231109, filed Aug. 6, 2004, the entire contents of both of which are incorporated herein by reference.

BACKGROUND OF THE INVENTION

1. Field of the Invention

The present invention relates to a display device that includes inspection wiring lines for inspecting a wiring defect, an inspection method for inspecting a wiring defect on the basis of inspection signals that are input to the inspection wiring lines of the display device, and an inspection device that generates inspection signals, which are input to the inspection wiring lines of the display device.

2. Description of the Related Art

A display device, such as a liquid crystal display device, includes an effective display section that is composed of display pixels arranged in a matrix. The effective display device includes a plurality of scan lines extending along rows of the display pixels, a plurality of signal lines extending along columns of the display pixels, switching elements that are disposed near intersections between the scan lines and signal lines, and pixel electrodes that are connected to the switching elements.

A wiring line group that connects a scan line driving circuit and the scan lines is, in usual cases, disposed on one end side of the effective display section. By inputting inspection signals to odd-number-th scan lines and even-number-th scan lines, it is possible to inspect a wiring defect on a panel, such as short-circuit or line breakage in the wiring line group or short-circuit or line breakage in the effective display section.

On the other hand, there has been proposed such a layout that an odd-number-th wiring line group comprising lines connected to odd-number-th scan lines is disposed on one end side of the effective display section, and an even-number-th wiring line group comprising lines connected to even-number-th scan lines is disposed on the other end side of the effective display section (see, e.g. Jpn. Pat. Appln. KOKAI Publication No. 06-160898 and Jpn. Pat. Appln. KOKAI Publication No. 2001-013892). This layout is optimal, in particular, for a structure that adopts a single driving IC chip in which a scan line driving section and a signal line driving section are integrated.

In the case of this layout, by inputting inspection signals to the odd-number-th scan lines and even-number-th scan lines, it is possible to inspect a wiring defect in the effective display section. However, it is not possible to inspect a wiring defect in each of the wiring line groups. Consequently, a panel with a wiring defect in the wiring line group, which could not be detected, may go to a subsequent fabrication step. In the subsequent fabrication step, expensive components, as a driving IC chip and a flexible print circuit board (FPC), are mounted. Thus, if the defective panel goes to the subsequent fabrication step, this leads to a decrease in manufacturing yield.

BRIEF SUMMARY OF THE INVENTION

The present invention has been made in consideration of the above-described problems, and the object of the invention is to provide a display device, which can exactly detect a wiring defect on a panel and can suppress a decrease in manufacturing yield.

According to a first aspect of the present invention, there is provided a display device comprising: an effective display section composed of a plurality of display pixels; a first wiring line group that is disposed on one end side of a peripheral part, which is located on an outside of the effective display section, and that comprises wiring lines connected to odd-number-th scan lines, to which driving signals for turning on/off the display pixels on odd-number-th rows are supplied; a second wiring line group that is disposed on the other end side of the peripheral part, and comprises wiring lines connected to even-number-th scan lines, to which driving signals for turning on/off the display pixels on even-number-th rows are supplied; a first inspection wiring line that is connected to first wiring lines of the first wiring line group and to third wiring lines of the second wiring line group; and a second inspection wiring line that is connected to second wiring lines of the first wiring line group, which neighbor the first wiring lines, and to fourth wiring lines of the second wiring line group, which neighbor the third wiring lines.

According to a second aspect of the invention, there is provided a display device comprising: an effective display section composed of a plurality of display pixels; a first wiring line group that is disposed on one end side of a peripheral part, which is located on an outside of the effective display section, and that comprises wiring lines connected to odd-number-th scan lines, to which driving signals for turning on/off the display pixels on odd-number-th rows are supplied; a second wiring line group that is disposed on the other end side of the peripheral part, and comprises wiring lines connected to even-number-th scan lines, to which driving signals for turning on/off the display pixels on even-number-th rows are supplied; a first inspection wiring line that is connected to first wiring lines of the first wiring line group and to second wiring lines of the first wiring line group, which neighbor the first wiring lines; a second inspection wiring line that is connected to third wiring lines of the second wiring line group and to fourth wiring lines of the second wiring line group, which neighbor the third wiring lines; a first switching signal line that is supplied with a switching signal for ON/OFF controlling first switch elements, which are disposed between the first inspection wiring line and the first wiring lines, and third switch elements, which are disposed between the second inspection wiring line and the third wiring lines; and a second switching signal line that is supplied with a switching signal for ON/OFF controlling second switch elements, which are disposed between the first inspection wiring line and the second wiring lines, and fourth switch elements, which are disposed between the second inspection wiring line and the fourth wiring lines.

The present invention may provide a display device, which can exactly detect a wiring defect on a panel and can suppress a decrease in manufacturing yield.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Display devices according to embodiments of the present invention will now be described with reference to the accompanying drawings.

First Embodiment

Figure 1:
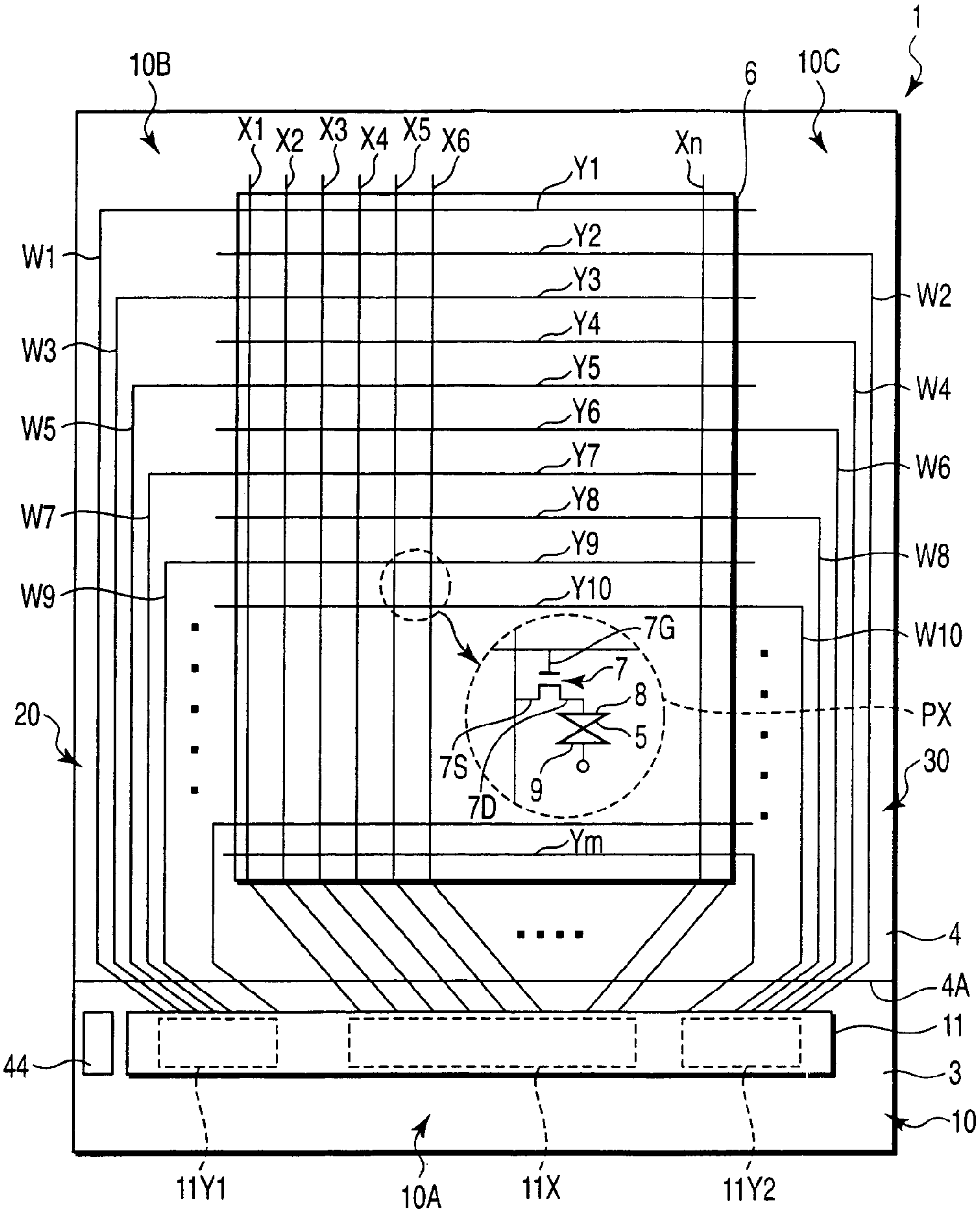
FIG. 1 schematically shows the structure of a liquid crystal display panel of a liquid crystal display device according to an embodiment of the present invention.

As is shown in FIG. 1, a liquid crystal display device, which is an example of a display device according to a first embodiment, includes a substantially rectangular, planar liquid crystal display panel 1. The liquid crystal display panel 1 comprises a pair of substrates, that is, an array substrate 3 and a counter-substrate 4, and a liquid crystal layer 5 that is interposed as an optical modulation layer between the pair of substrates. The liquid crystal display panel 1 includes a rectangular effective display section 6 that displays an image. The effective display section 6 is composed of a plurality of display pixels PX that are arranged in a matrix.

The array substrate 3 includes, in the effective display section 6, a plurality of scan lines Y (1, 2, 3, . . . , m) that extend in a row direction of the display pixels PX, a plurality of signal lines X (1, 2, 3, . . . , n) that extend in a column direction of the display pixels PX, switching elements 7 that are arranged for the respective display pixels PX near intersections between scan lines Y and signal lines X, and pixel electrodes 8 that are connected to the switching elements 7.

The switching element 7 is formed of, e.g. a thin-film transistor (TFT). The switching element 7 has a gate electrode 7G that is electrically connected to the associated scan line Y (or formed integral with the scan line). The switching element 7 has a source electrode 7S that is electrically connected to the associated signal line X (or formed integral with the signal line). The switching element 7 has a drain electrode 7D that is electrically connected to the pixel electrode 8 of the associated display pixel PX.

The counter-substrate 4 includes a counter-electrode 9 that is common to all the display pixels PX in the effective display section 6. The array substrate 3 and counter-substrate 4 are disposed such that the pixel electrodes 8 are opposed to the counter-electrode 9, and a gap is provided therebetween. The liquid crystal layer 5 is formed of a liquid crystal composition that is sealed in the gap between the array substrate 3 and counter-substrate 4.

In a color display type liquid crystal display device, the liquid crystal display panel 1 includes a plurality of kinds of display pixels, for instance, a red pixel that displays red (R), a green pixel that displays green (G), and a blue pixel that displays blue (B). Specifically, the red pixel includes a red color filter that passes light with a principal wavelength of red. The green pixel includes a green color filter that passes light with a principal wavelength of green. The blue pixel includes a blue color filter that passes light with a principal wavelength of blue. These color filters are disposed on a major surface of the array substrate 3 or counter-substrate 4.

The liquid crystal display panel 1 includes a driving IC chip 11 that is disposed on a peripheral part 10 on the outside of the effective display section 6. In the example shown in FIG. 1, the driving IC chip 11 is disposed on an extension part 10A of the array substrate 3, which extends outward beyond an end portion 4A of the counter-substrate 4. The driving IC chip 11 includes a signal line driving section 11X that supplies driving signals (video signals) to the signal lines X, and a scan line driving section 11Y that supplies driving signals (scan signals) to the scan lines Y.

The scan line driving section 11Y includes a first driving unit 11Y1 that outputs driving signals to odd-number-th scan lines Y (1, 3, 5, . . . ), and a second driving unit 11Y2 that outputs driving signals to even-number-th scan lines Y (2, 4, 6, . . . ). The first driving unit 11Y1 and second driving unit 11Y2 are disposed on both sides of the signal line driving section 11X so as to sandwich the signal line driving section 11X.

To be more specific, the first driving unit 11Y1 is electrically connected to the odd-number-th scan lines Y (1, 3, 5, . . . ) via a first wiring line group 20 that is disposed on one end side 10B of the peripheral part 10. The first wiring line group 20 comprises wiring lines W (1, 3, 5, . . . ) that are connected to the odd-number-th scan lines Y (1, 3, 5, . . . ). Driving signals that are output from the first driving unit 11Y1 are supplied via the wiring lines W (1, 3, 5, . . . ) to the associated odd-number-th scan lines Y (1, 3, 5, . . . ), thereby turning on/off the display pixels PX on the odd-number-th rows. That is, the switching element 7 that is included in each display pixel PX is ON/OFF controlled on the basis of the driving signal that is supplied from the associated scan line Y.

The second driving unit 11Y2 is electrically connected to the even-number-th scan lines Y (2, 4, 6, . . . ) via a second wiring line group 30 that is disposed on the other end side 10C of the peripheral part 10. The second wiring line group 30 comprises wiring lines W (2, 4, 6, . . . ) that are connected to the even-number-th scan lines Y (2, 4, 6, . . . ). Driving signals that are output from the second driving unit 11Y2 are supplied via the wiring lines W (2, 4, 6, . . . ) to the associated even-number-th scan lines Y (2, 4, 6, . . . ), thereby turning on/off the display pixels PX on the even-number-th rows.

Figure 2:
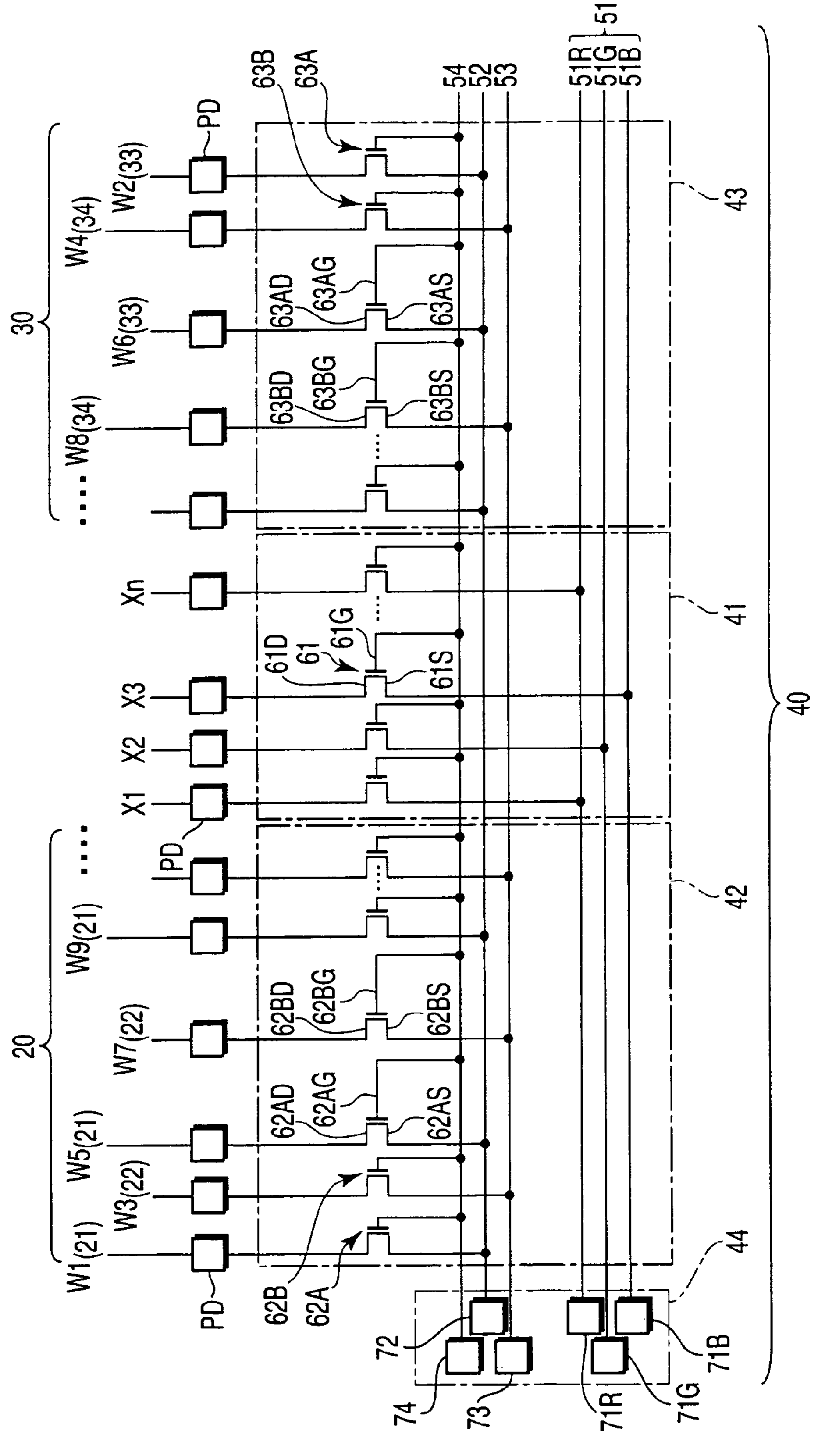
FIG. 2 schematically shows the structure of an inspection wiring line section according to a first embodiment, which is applicable to the liquid crystal display panel shown in FIG. 1.

As is shown in FIG. 2, the array substrate 3 includes an inspection wiring line section 40 for inspecting a wiring defect between the lines of the first wiring line group 20 and a wiring defect between the lines of the second wiring line group 30 on the peripheral part 10, and a wiring defect in the effective display section 6. The inspection wiring line section 40 includes a signal line inspection section 41 that is provided in association with the signal line driving section 11X, a first scan line inspection section 42 that is provided in association with the first driving unit 11Y1 of the scan line driving section 11Y, a second scan line inspection section 43 that is provided in association with the second driving unit 11Y2 of the scan line driving section 11Y, and a pad section 44 for inputting various signals to the respective inspection sections 41, 42 and 43.

The signal line inspection section 41 includes signal line inspection wiring lines 51 that are connected to the associated signal lines X. In this example, the signal line inspection wiring lines 51 comprise a red inspection wiring line 51R for supplying an inspection signal to the signal line connected to the red pixel, a green inspection wiring line 51G for supplying an inspection signal to the signal line connected to the green pixel, and a blue inspection wiring line 51B for supplying an inspection signal to the signal line connected to the blue pixel.

The signal line inspection section 41 also includes switch elements 61 between the signal lines X (1, 2, . . . , n) and the signal line inspection wiring lines 51 (R, G, B). Each of the switch elements 61 is composed of a thin-film transistor. A gate electrode 61G of the switch element 61 is electrically connected to a common switching signal line 54. A source electrode 61S of the switch element 61 is electrically connected to the associated signal line inspection wiring line 51 (R, G, B). A drain electrode 61D of the switch element 61 is electrically connected to the associated signal line X.

The first scan line inspection section 42 includes a first inspection wiring line 52 that is connected to first wiring lines 21, for instance, wiring lines W1, W5, W9, . . . , of the first wiring line group 20, and a second inspection wiring line 53 that is connected to second wiring lines 22, for instance, wiring lines W3, W7, W11, . . . , which neighbor the first wiring lines 21. The first scan line inspection section 42 also includes first switch elements 62A between the first wiring lines 21 and the first inspection wiring line 52, and second switch elements 62B between the second wiring lines 22 and the second inspection wiring line 53. The first switch elements 62A and the second switch elements 62B are composed of thin-film transistors.

Specifically, a gate electrode 62AG of the first switch element 62A is electrically connected to the common switching signal line 54. A source electrode 62AS of the first switch element 62A is electrically connected to the associated first inspection wiring line 52. A drain electrode 62AD of the first switch element 62A is electrically connected to the associated first wiring line 21.

A gate electrode 62BG of the second switch element 62B is electrically connected to the common switching signal line 54. A source electrode 62BS of the second switch element 62B is electrically connected to the associated second inspection wiring line 53. A drain electrode 62BD of the second switch element 62B is electrically connected to the associated second wiring line 22.

The second scan line inspection section 43 includes the first inspection wiring line 52 that is connected to third wiring lines 33, for instance, wiring lines W2, W6, W10, . . . , of the second wiring line group 30, and the second inspection wiring line 53 that is connected to fourth wiring lines 34, for instance, wiring lines W4, W8, W12, . . . , which neighbor the third wiring lines 33. The second scan line inspection section 43 also includes third switch elements 63A between the third wiring lines 33 and the first inspection wiring line 52, and fourth switch elements 63B between the fourth wiring lines 34 and the second inspection wiring line 53. The third switch elements 63A and the fourth switch elements 63B are composed of thin-film transistors.

Specifically, a gate electrode 63AG of the third switch element 63A is electrically connected to the common switching signal line 54. A source electrode 63AS of the third switch element 63A is electrically connected to the associated first inspection wiring line 52, which is common to the first switch elements 62A. A drain electrode 63AD of the third switch element 63A is electrically connected to the associated third wiring line 33.

A gate electrode 63BG of the fourth switch element 63B is electrically connected to the common switching signal line 54. A source electrode 63BS of the fourth switch element 63B is electrically connected to the associated second inspection wiring line 53, which is common to the second switch elements 62B. A drain electrode 63BD of the fourth switch element 63B is electrically connected to the associated fourth wiring line 34.

The pad section 44 includes input pads 71 (R, G, B), each of which enables input of a driving signal to one end of the associated signal line inspection wiring line 51 (R, G, B), an input pad 72 that enables input of a driving signal to one end of the first inspection wiring line 52, an input pad 73 that enables input of a driving signal to one end of the second inspection wiring line 53, and an input pad 74 that enables input of a driving signal to one end of the switching signal line 54.

The driving signals that are input from the input pads 71 (R, G, B) are inspection video signals that are written in the pixel electrodes 8 of the display pixels PX at a stage of inspections. The driving signals that are input from the input pads 72 and 73 are inspection signals for ON/OFF controlling the switching elements 7 of the display pixels PX at a stage of inspections. The driving signal that is input from the input pad 74 is a switching signal for ON/OFF controlling the switch elements 61, 62 and 63 of the respective inspection sections at a stage of inspections.

The signal lines X (1, 2, . . . , n), the first wiring lines 21 and second wiring lines 22 of the first wiring line group 20, and the third wiring lines 33 and fourth wiring lines 34 of the second wiring line group 30 include connection pads PD at their intermediate portions, which enable connection to the driving IC chip 11.

The liquid crystal display device with the above-described structure has such a layout that driving signals can be supplied to the odd-number-th scan lines and even-number-th scan lines from both end sides of the effective display section. In this layout, it is possible to input different inspection signals at different timings to the first wiring lines and neighboring second wiring lines of the first wiring line group for supplying driving signals to the odd-number-th scan lines, and to input different inspection signals at different timings to the third wiring lines and neighboring fourth wiring lines of the second wiring line group for supplying driving signals to the even-number-th scan lines. It is thus possible to exactly detect wiring defects on the panel, such as short-circuit between the wiring lines of the first wiring line group or line breakage of each wiring line, and short-circuit between the wiring lines of the second wiring line group or line breakage of each wiring line.

According to the liquid crystal display device with the above-described structure, since the number of wiring lines disposed on the inspection wiring line section can be decreased, the manufacturing cost can be reduced and the outer peripheral part can be reduced in size. Accordingly, the size of the picture-frame-like peripheral part can be narrowed.

The signal line inspection section 41, first scan line inspection section 42 and second scan line inspection section 43 are disposed on the extension part 10A of the array substrate 3 at a position corresponding to a region where the driving IC chip 11 is disposed. Needless to say, the first inspection wiring line 52 and second inspection wiring line 53 are disposed on the extension part 10A. The first inspection wiring line 52 and second inspection wiring line 53 extend in a longitudinal direction of the driving IC chip 11. Thus, the first inspection wiring line 52 and second inspection wiring line 53 overlap the driving IC chip 11 when the driving IC chip 11 is mounted. In short, the inspection wiring lines can be disposed on the array substrate without increasing the outer dimensions.

(Inspection Device)

Next, a description is given of an inspection device 100 for detecting a wiring defect on the liquid crystal display panel in the liquid crystal display device having the above-described structure.

An inspection device for a display device, which is applicable to the first embodiment, is as follows:

An inspection device for a display device, the display device comprising:

an effective display section composed of a plurality of display pixels;

a first wiring line group that is disposed on one end side of a peripheral part, which is located on an outside of the effective display section, and that comprises wiring lines connected to odd-number-th scan lines, to which driving signals for turning on/off the display pixels on odd-number-th rows are supplied; and a second wiring line group that is disposed on the other end side of the peripheral part, and comprises wiring lines connected to even-number-th scan lines, to which driving signals for turning on/off the display pixels on even-number-th rows are supplied, the inspection device comprising:

signal generating means for generating a first inspection signal that is input to a first inspection wiring line, which is connected to first wiring lines of the first wiring line group and to third wiring lines of the second wiring line group, and a second inspection signal that is input to a second inspection wiring line that is connected to second wiring lines of the first wiring line group, which neighbor the first wiring lines, and to fourth wiring lines of the second wiring line group, which neighbor the third wiring lines.

Figures 3, 4:
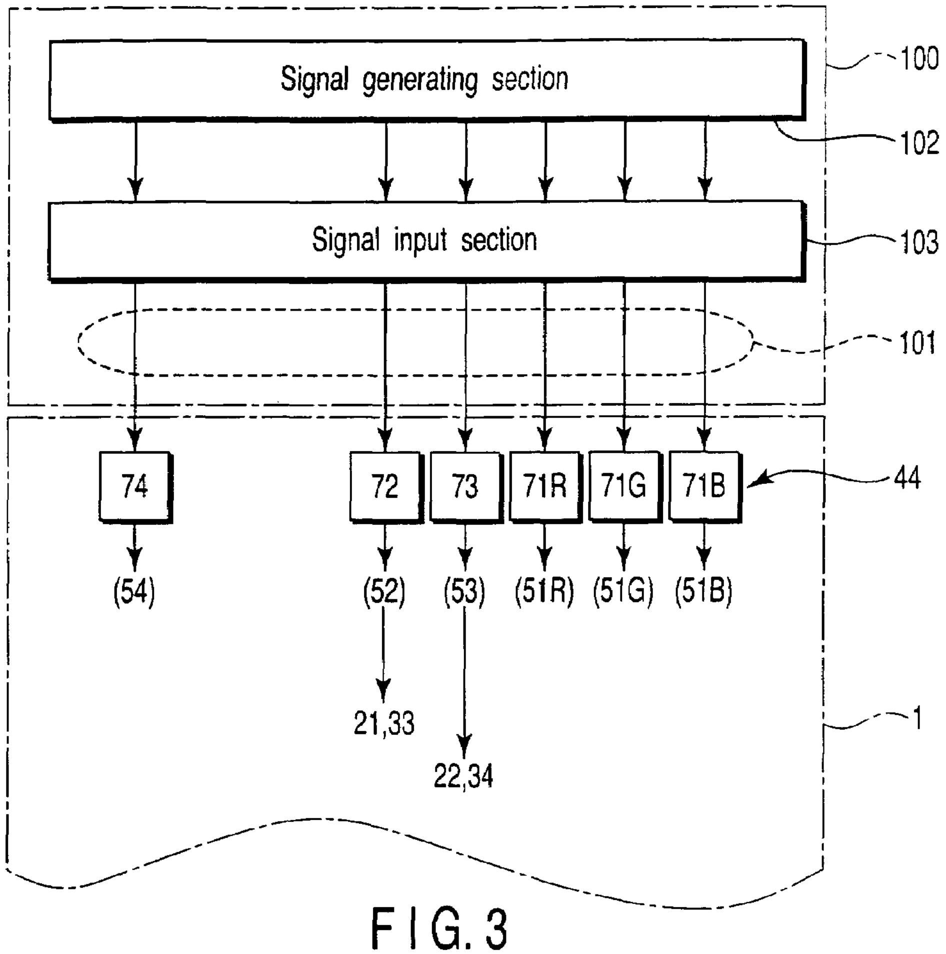
FIG. 3 schematically shows the structure of an inspection device according to the first embodiment, which is applicable to the liquid crystal display panel shown in FIG. 1.
FIG. 4 is a view for explaining an inspection method according to the first embodiment, which is applicable to the liquid crystal display panel shown in FIG. 1.

Specifically, as shown in FIG. 3, the inspection device 100 includes a plurality of probes 101 that are connectable to the input pads of the pad section 44, a signal generating section (signal generating means) 102 that generates various signals including inspection signals that are to be input to the first inspection wiring line 52 and second inspection wiring line 53 via the probes 101 and a switching signal that is to be input to the switching signal line 54 via the probes 101, and a signal input section (signal input means) 103 that inputs the inspection signals, which are generated by the signal generating section 102, to the associated first inspection wiring line 52 and second inspection wiring line 53.

(Inspection Method)

An inspection method for a display device, which is applicable to the first embodiment, is as follows:

An inspection method for a display device, the display device comprising:

an effective display section composed of a plurality of display pixels;

a first wiring line group that is disposed on one end side of a peripheral part, which is located on an outside of the effective display section, and that comprises wiring lines connected to odd-number-th scan lines, to which driving signals for turning on/off the display pixels on odd-number-th rows are supplied; and a second wiring line group that is disposed on the other end side of the peripheral part, and comprises wiring lines connected to even-number-th scan lines, to which driving signals for turning on/off the display pixels on even-number-th rows are supplied, the inspection method comprising:

inputting a first inspection signal to a first inspection wiring line that is connected to first wiring lines of the first wiring line group, inputting a second inspection signal to a second inspection wiring line that is connected to second wiring lines of the first wiring line group, which neighbor the first wiring lines, inputting the first inspection signal to the first inspection wiring line that is connected to third wiring lines of the second wiring line group, and inputting the second inspection signal to the second inspection wiring line that is connected to fourth wiring lines of the second wiring line group, which neighbor the third wiring lines; and inspecting, on the basis of the input of the first and second inspection signals, a wiring defect in the first wiring line group, a wiring defect in the second wiring line group, and a wiring defect in the odd-number-th scan lines and the even-number-th scan lines in the effective display section.

Specifically, in this inspection method, the probes 101 of the inspection device 100 are connected to the input pads of the pad section 44 of the liquid crystal display panel 1. At a predetermined timing, the signal input section 103 inputs a switching signal, which is generated by the signal generating section 102, to the switching signal line 54. By the input of the switching signal, the switch elements 61 of the signal line inspection section 41, the first switch elements 62A and second switch elements 62B of the first scan line inspection section 42 and the third switch elements 63A and fourth switch elements 63B of the second scan line inspection section 43 are turned on at proper timings.

Upon turning on of the first switch elements 62A, the signal input section 103 inputs the first inspection signal to the first inspection wiring line 52 that is connected to the first wiring lines 21 of the first wiring line group 20. Thereby, the first inspection signal is supplied to the odd-number-th scan lines that are connected to the first wiring lines 21. By the input of the first inspection signal, the switching elements 7 that are connected to the odd-number-th scan lines in the effective display section 6 are turned on at proper timings.

In addition, upon turning on of the second switch elements 62B, the signal input section 103 inputs the second inspection signal to the second inspection wiring line 53 that is connected to the second wiring lines 22 of the first wiring line group 20. Thereby, the second inspection signal is supplied to the odd-number-th scan lines that are connected to the second wiring lines 22. By the input of the second inspection signal, the switching elements 7 that are connected to the odd-number-th scan lines in the effective display section 6 are turned on at proper timings.

On the other hand, upon turning on of the third switch elements 63A, the signal input section 103 inputs the first inspection signal to the first inspection wiring line 52 that is connected to the third wiring lines 33 of the second wiring line group 30. Thereby, the first inspection signal is supplied to the even-number-th scan lines that are connected to the third wiring lines 33. By the input of the first inspection signal, the switching elements 7 that are connected to the even-number-th scan lines in the effective display section 6 are turned on at proper timings.

In addition, upon turning on of the fourth switch elements 63B, the signal input section 103 inputs the second inspection signal to the second inspection wiring line 53 that is connected to the fourth wiring lines 34 of the second wiring line group 30. Thereby, the second inspection signal is supplied to the even-number-th scan lines that are connected to the fourth wiring lines 34. By the input of the second inspection signal, the switching elements 7 that are connected to the even-number-th scan lines in the effective display section 6 are turned on at proper timings.

Subsequently, on the basis of the input of the first and second inspection signals, short-circuit between the first wiring line 21 and second wiring line 22 of the first wiring line group 20, short-circuit between the third wiring line 33 and fourth wiring line 34 of the second wiring line group 30, and short-circuit between the odd-number-th scan line and even-number-th scan line in the effective display section 6 are inspected. In this inspection step, the signal generating section 102 inputs the inspection video signals to the respective signal lines X via the signal line inspection wiring lines 51 (R, G, B) in the state in which the switching elements 7 in the effective display section 6 are turned on. Thereby, the inspection video signals are written in the display pixels PX in the effective display section 6 of the liquid crystal display panel 1. By the write of the inspection video signals, wiring defects of the various wiring lines on the liquid crystal display panel 1 are checked.

Specifically, as shown in FIG. 4, at a timing when signals can be input to the associated odd-number-th scan lines from the first wiring lines 21 of the first wiring line group 20, the first inspection signal is input from the first inspection wiring line 52 and the inspection video signals are input to the respective signal lines X. In this case, if short-circuit occurs between the neighboring first wiring line 21 and second wiring line 22 in the first wiring line group 20, for example, if short-circuit occurs between the wiring line W1 and wiring line W3, the first inspection signal is supplied not only to the scan line Y1, which is connected to the wiring line W1, but also to the scan line Y3, which is connected to the wiring line W3. Consequently, the switching elements 7 of the display pixels PX that are connected to the scan line Y3, as well as the switching elements 7 of the display pixels PX that are connected to the scan line Y1, are turned on at the same time. In a normal case, the switching elements 7 of the display pixels PX, which are connected to the scan lines Y1, Y5, Y9, . . . , are to be turned on. However, due to the short-circuit between the wiring lines W1 and W3, the switching elements 7 of the display pixels PX, which are connected to the scan lines Y1, Y3, Y5 and Y9, . . . , are turned on.

In this way, if the inspection video signals are supplied in the state in which the respective switching elements 7 are turned on, the associated display pixels PX on the liquid crystal display panel 1 are turned on. By observing the turn-on states of the display pixels PX on the liquid crystal display panel 1, short-circuit between the first wiring line 21 and second wiring line 22 in the first wiring line group 20 can be checked.

Similarly, at a timing when signals can be input to the associated odd-number-th scan lines from the second wiring lines 22 of the first wiring line group 20, the second inspection signal is input from the second inspection wiring line 53 and the inspection signals are input to the respective signal lines X. Thereby, short-circuit between the first wiring line 21 and second wiring line 22 in the first wiring line group 20 can be checked.

In addition, as shown in FIG. 4, at a timing when signals can be input to the associated even-number-th scan lines from the third wiring lines 33 of the second wiring line group 30, the first inspection signal is input from the first inspection wiring line 52 and the inspection video signals are input to the respective signal lines X. In this case, if short-circuit occurs between the neighboring third wiring line 33 and fourth wiring line 34 in the second wiring line group 30, for example, if short-circuit occurs between the wiring line W2 and wiring line W4, the first inspection signal is supplied not only to the scan line Y2, which is connected to the wiring line W2, but also to the scan line Y4, which is connected to the wiring line W4. Consequently, the switching elements 7 of the display pixels PX that are connected to the scan line Y4, as well as the switching elements 7 of the display pixels PX that are connected to the scan line Y2, are turned on at the same time. In a normal case, the switching elements 7 of the display pixels PX, which are connected to the scan lines Y2, Y6, Y10, . . . , are to be turned on. However, due to the short-circuit between the wiring lines W2 and W4, the switching elements 7 of the display pixel PX, which are connected to the scan lines Y2, Y4, Y6 and Y10, . . . , are turned on. Thus, short-circuit between the third wiring line 33 and fourth wiring line 34 in the second wiring line group 30 can be checked.

Similarly, at a timing when signals can be input to the associated even-number-th scan lines from the fourth wiring lines 34 of the second wiring line group 30, the second inspection signal is input from the second inspection wiring line 53 and the inspection signals are input to the respective signal lines X. Thereby, short-circuit between the third wiring line 33 and fourth wiring line 34 in the second wiring line group 30 can be checked.

Besides, it is possible to inspect short-circuit between the odd-number-th scan line and the even-number-th scan line in the effective display section 6, at the same time as the inspection of short-circuit in the first wiring line group 20 and second wiring line group 30. Assume now that short-circuit occurs between the odd-number-th scan line and even-number-th scan line, for example, short-circuit occurs between the scan line Y1 and scan line Y2. In this case, if the first inspection signal is input from the first wiring line 21 to the associated odd-number-th scan line in the step of inspecting short-circuit between the first wiring line 21 and second wiring line 22 of the first wiring line group 20, the first inspection signal is supplied to the scan line Y1 and the scan line Y3. Consequently, the switching elements 7 of the display pixels PX that are connected to the scan line Y2, as well as the switching elements 7 of the display pixels PX that are connected to the scan line Y1, are turned on at the same time. In a normal case, the switching elements 7 of the display pixels PX, which are connected to the scan lines Y1, Y5, Y9, . . . , are to be turned on. However, due to the short-circuit between the scan line Y1 and scan line Y2, the switching elements 7 of the display pixels PX, which are connected to the scan lines Y1, Y2, Y5 and Y9, are turned on.

In this way, if the inspection video signals are supplied to the signal lines X in the state in which the respective switching elements 7 are turned on, the associated display pixels PX on the liquid crystal display panel 1 are turned on. By observing the turn-on states of the display pixels PX on the liquid crystal display panel 1, short-circuit between the neighboring scan lines can be checked.

Furthermore, according to the above-described inspection method, in addition to the inspection of short-circuit between wiring lines, it is also possible to inspect line breakage between the connection pad PD, which enables connection to the driving IC chip 11, and the terminal end of each wiring line, by observing the turn-on state of the display pixel PX on the liquid crystal display panel 1. Specifically, on the basis of the input of the various inspection signals, the turn-on state of the display pixels PX is observed. Thereby, it is possible to inspect line breakage between the first wiring line 21 and second wiring line 22 of the first wiring line group 20, line breakage between the third wiring line 33 and fourth wiring line 34 of the second wiring line group 30, and line breakage occurring at a point over the length to the terminal ends of the scan lines Y and signal lines X in the effective display section 6 (if line breakage occurs, the associated display pixel PX is not turned on).

As has been described above, according to the inspection method, in the liquid crystal display device with such a layout that driving signals can be supplied to the odd-number-th scan lines and even-number-th scan lines from both end sides of the effective display section, the inspection device inputs the first inspection signal to the first wiring lines of the first wiring line group, and inputs the second inspection signal, at a different timing, to the second wiring lines that neighbor the first wiring lines. Based on the input of the inspection signals, it is possible to exactly detect a wiring defect in the first wiring line group. In addition, the inspection device inputs the first inspection signal to the third wiring lines of the second wiring line group, and inputs the second inspection signal, at a different timing, to the fourth wiring lines that neighbor the third wiring lines. Based on the input of the inspection signals, it is possible to exactly detect a wiring defect in the second wiring line group. At the same time, it is possible to exactly detect wiring defects such as short-circuit between the odd-number-th scan line and even-number-th scan line in the effective display section, and line breakage of the scan line and the signal line. Thus, it is possible to prevent a liquid crystal display panel with a wiring defect from going to a subsequent fabrication step, and to suppress a decrease in manufacturing yield.

Second Embodiment

In the description of a second embodiment of the invention, the structural elements that are common to those in the first embodiment are denoted by like reference numerals. The structure of the liquid crystal display panel 1, which is applicable to the second embodiment, is the same as that in the first embodiment, so a description thereof is omitted.

Figure 5:
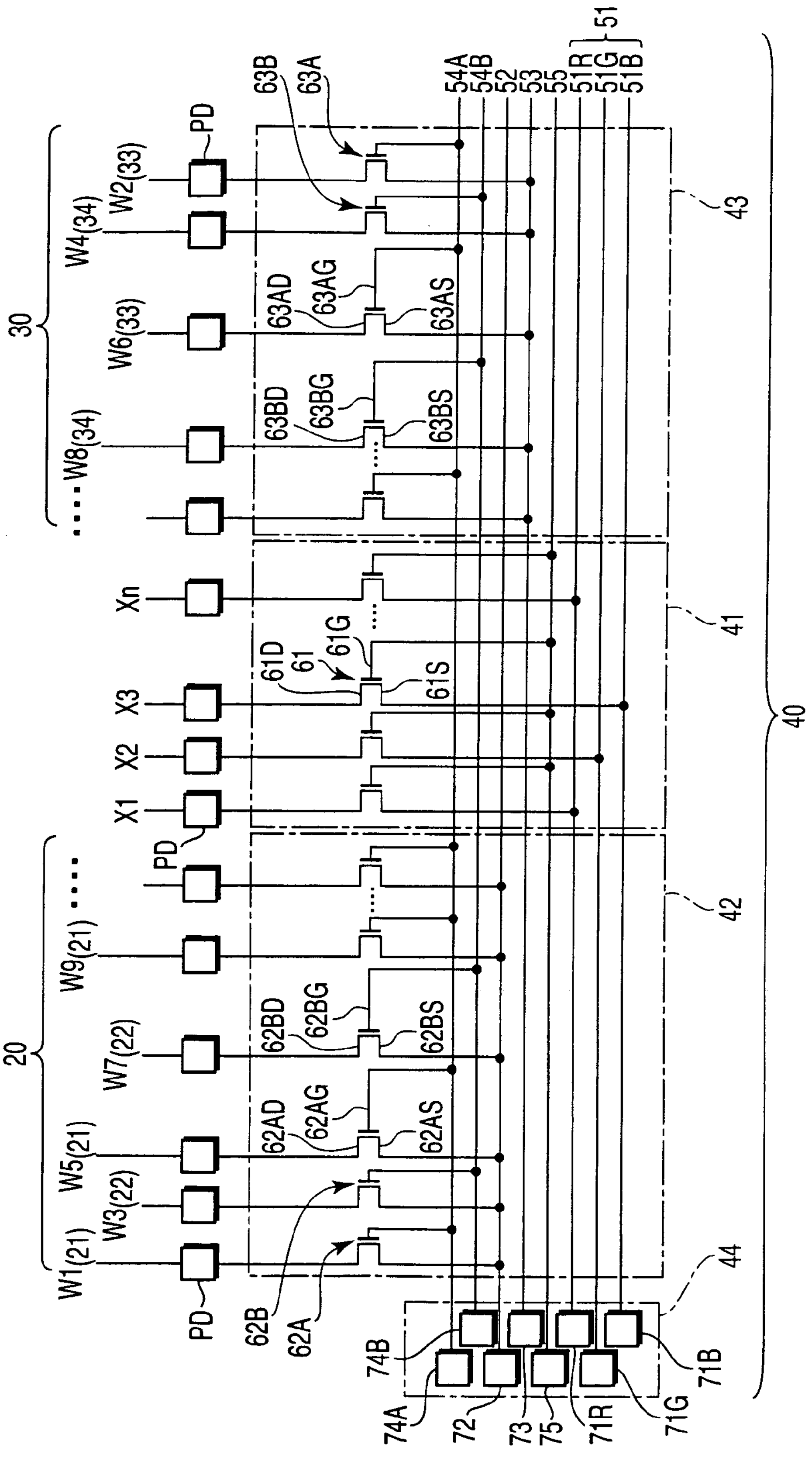
FIG. 5 schematically shows the structure of an inspection wiring line section according to a second embodiment, which is applicable to the liquid crystal display panel shown in FIG. 1.

In the second embodiment, as shown in FIG. 5, the array substrate 3 includes an inspection wiring line section 40 for inspecting a wiring defect between the lines of the first wiring line group 20 and a wiring defect between the lines of the second wiring line group 30 on the peripheral part 10, and a wiring defect in the effective display section 6. The inspection wiring line section 40 includes a signal line inspection section 41 that is provided in association with the signal line driving section 11X, a first scan line inspection section 42 that is provided in association with the first driving unit 11Y1 of the scan line driving section 11Y, a second scan line inspection section 43 that is provided in association with the second driving unit 11Y2 of the scan line driving section 11Y, and a pad section 44 for inputting various signals to the respective inspection sections 41, 42 and 43.

The signal line inspection section 41 includes signal line inspection wiring lines 51 that are connected to the associated signal lines X. In this example, the signal line inspection wiring lines 51 comprise a red inspection wiring line 51R for supplying an inspection signal to the signal line connected to the red pixel, a green inspection wiring line 51G for supplying an inspection signal to the signal line connected to the green pixel, and a blue inspection wiring line 51B for supplying an inspection signal to the signal line connected to the blue pixel.

The signal line inspection section 41 also includes switch elements 61 between the signal lines X (1, 2, . . . , n) and the signal line inspection wiring lines 51 (R, G, B). Each of the switch elements 61 is composed of a thin-film transistor. A gate electrode 61G of the switch element 61 is electrically connected to a common switching signal line 55. A source electrode 61S of the switch element 61 is electrically connected to the associated signal line inspection wiring line 51 (R, G, B). A drain electrode 61D of the switch element 61 is electrically connected to the associated signal line X.

The first scan line inspection section 42 includes a first inspection wiring line 52 that is connected to first wiring lines 21, for instance, wiring lines W1, W5, W9, . . . , of the first wiring line group 20, and to second wiring lines 22, for instance, wiring lines W3, W7, W11, . . . , which neighbor the first wiring lines 21. The first scan line inspection section 42 also includes first switch elements 62A between the first wiring lines 21 and the first inspection wiring line 52, and second switch elements 62B between the second wiring lines 22 and the first inspection wiring line 52. The first switch elements 62A and the second switch elements 62B are composed of thin-film transistors.

Specifically, a gate electrode 62AG of the first switch element 62A is electrically connected to a first switching signal line 44A. A source electrode 62AS of the first switch element 62A is electrically connected to the associated first inspection wiring line 52. A drain electrode 62AD of the first switch element 62A is electrically connected to the associated first wiring line 21.

A gate electrode 62BG of the second switch element 62B is electrically connected to a second switching signal line 54B. A source electrode 62BS of the second switch element 62B is electrically connected to the associated first inspection wiring line 52. A drain electrode 62BD of the second switch element 62B is electrically connected to the associated second wiring line 22.

The second scan line inspection section 43 includes a second inspection wiring line 53 that is connected to third wiring lines 33, for instance, wiring lines W2, W6, W10, . . . , of the second wiring line group 30, and to fourth wiring lines 34, for instance, wiring lines W4, W8, W12, . . . , which neighbor the third wiring lines 33. The second scan line inspection section 43 also includes third switch elements 63A between the third wiring lines 33 and the second inspection wiring line 53, and fourth switch elements 63B between the fourth wiring lines 34 and the second inspection wiring line 53. The third switch elements 63A and the fourth switch elements 63B are composed of thin-film transistors.

Specifically, a gate electrode 63AG of the third switch element 63A is electrically connected to the first switching signal line 54A, which is common to the first switch elements 62A. A source electrode 63AS of the third switch element 63A is electrically connected to the associated second inspection wiring line 53. A drain electrode 63AD of the third switch element 63A is electrically connected to the associated third wiring line 33.

A gate electrode 63BG of the fourth switch element 63B is electrically connected to the second switching signal line 54B, which is common to the second switch elements 62B. A source electrode 63BS of the fourth switch element 63B is electrically connected to the associated second inspection wiring line 53. A drain electrode 63BD of the fourth switch element 63B is electrically connected to the associated fourth wiring line 34.

The pad section 44 includes input pads 71 (R, G, B), each of which enables input of a driving signal to one end of the associated signal line inspection wiring line 51 (R, G, B), an input pad 72 that enables input of a driving signal to one end of the first inspection wiring line 52, an input pad 73 that enables input of a driving signal to one end of the second inspection wiring line 53, an input pad 74A that enables input of a driving signal to one end of the first switching signal line 54A, an input pad 74B that enables input of a driving signal to one end of the second switching signal line 54B, and an input pad 75 that enables input of a driving signal to one end of the switching signal line 55.

The driving signals that are input from the input pads 71 (R, G, B) are inspection video signals that are written in the pixel electrodes 8 of the display pixels PX at a stage of inspections. The driving signals that are input from the input pads 72 and 73 are inspection signals for ON/OFF controlling the switching elements 7 of the display pixels PX at a stage of inspections. The driving signals that are input from the input pads 74A and 74B are switching signals for ON/OFF controlling the first switch elements 62A and second switch elements 62B of the first scan line inspection section 42, and the third switch elements 63A and fourth switch elements 63B of the second scan line inspection section 43 at a stage of inspections. The driving signal that is input from the input pad 75 is a switching signal for ON/OFF controlling the switch elements 61 of the signal line inspection section 41.

The signal lines X (1, 2, . . . , n), the first wiring lines 21 and second wiring lines 22 of the first wiring line group 20, and the third wiring lines 33 and fourth wiring lines 34 of the second wiring line group 30 include connection pads PD at their intermediate portions, which enable connection to the driving IC chip 11.

The liquid crystal display device with the above-described structure has such a layout that driving signals can be supplied to the odd-number-th scan lines and even-number-th scan lines from both end sides of the effective display section. In this layout, it is possible to input the inspection signal at different timings to the first wiring lines and neighboring second wiring lines of the first wiring line group for supplying driving signals to the odd-number-th scan lines, and to input the inspection signal at different timings to the third wiring lines and neighboring fourth wiring lines of the second wiring line group for supplying driving signals to the even-number-th scan lines. It is thus possible to exactly detect wiring defects on the panel, such as short-circuit between the wiring lines of the first wiring line group or line breakage of each wiring line, and short-circuit between the wiring lines of the second wiring line group or line breakage of each wiring line.

The signal line inspection section 41, first scan line inspection section 42 and second scan line inspection section 43 are disposed on the extension part 10A of the array substrate 3 at a position corresponding to a region where the driving IC chip 11 is disposed. Needless to say, the first inspection wiring line 52 and second inspection wiring line 53 are disposed on the extension part 10A. The first inspection wiring line 52 and second inspection wiring line 53 extend in a longitudinal direction of the driving IC chip 11. Thus, the first inspection wiring line 52 and second inspection wiring line 53 overlap the driving IC chip 11 when the driving IC chip 11 is mounted. In short, the inspection wiring lines can be disposed on the array substrate without increasing the outer dimensions.

(Inspection Device)

Next, a description is given of an inspection device 100 for detecting a wiring defect on the liquid crystal display panel in the liquid crystal display device having the above-described structure.

An inspection device for a display device, which is applicable to the second embodiment, is as follows:

An inspection device for a display device, the display device comprising:

an effective display section composed of a plurality of display pixels, a first wiring line group that is disposed on one end side of a peripheral part, which is located on an outside of the effective display section, and that comprises wiring lines connected to odd-number-th scan lines, to which driving signals for turning on/off the display pixels on odd-number-th rows are supplied;

a second wiring line group that is disposed on the other end side of the peripheral part, and comprises wiring lines connected to even-number-th scan lines, to which driving signals for turning on/off the display pixels on even-number-th rows are supplied;

a first inspection wiring line that is connected to first wiring lines of the first wiring line group and to second wiring lines of the first wiring line group, which neighbor the first wiring lines; and a second inspection wiring line that is connected to third wiring lines of the second wiring line group and to fourth wiring lines of the second wiring line group, which neighbor the third wiring lines, the inspection device comprising:

signal generating means for generating a common first switching signal that is input to first switch elements, which are disposed between the first inspection wiring line and the first wiring lines, and to third switch elements, which are disposed between the second inspection wiring line and the third wiring lines, a common second switching signal that is input to second switch elements, which are disposed between the first inspection wiring line and the second wiring lines, and to fourth switch elements, which are disposed between the second inspection wiring line and the fourth wiring lines, a first inspection signal that is input to the first inspection wiring line, and a second inspection signal that is input to the second inspection wiring line.

The inspection device may further comprise signal input means for inputting the first inspection signal, which is generated by the signal generating means, to the first inspection wiring line, and the second inspection signal, which is generated by the signal generating means, to the second inspection wiring line at a timing when the first switch elements and the third switch elements are turned on the basis of the input of the first switching signal, and for inputting the first inspection signal, which is generated by the signal generating means, to the first inspection wiring line, and the second inspection signal, which is generated by the signal generating means, to the second inspection wiring line at a timing when the second switch elements and the fourth switch elements are turned on the basis of the input of the second switching signal.

Figures 6, 7:
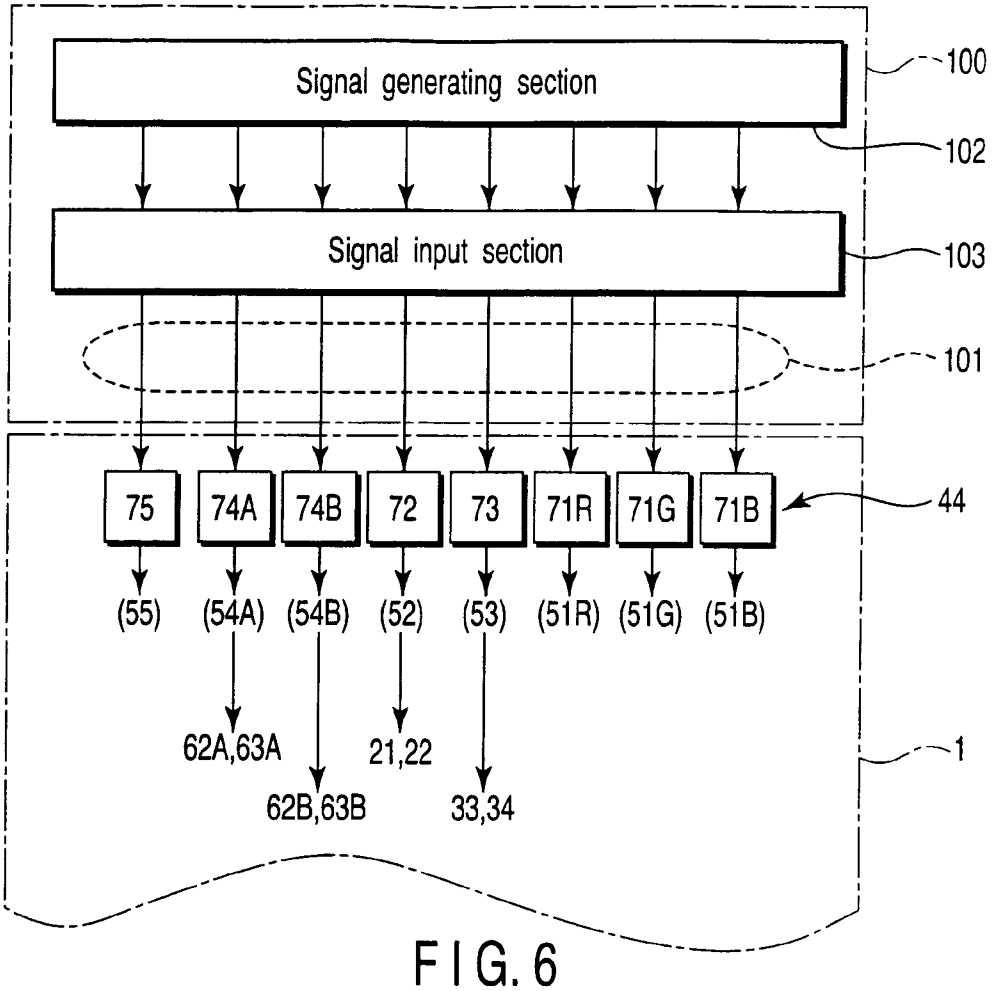
FIG. 6 schematically shows the structure of an inspection device according to the second embodiment, which is applicable to the liquid crystal display panel shown in FIG. 1.
FIG. 7 is a view for explaining an inspection method according to the second embodiment, which is applicable to the liquid crystal display panel shown in FIG. 1.

Specifically, as shown in FIG. 6, the inspection device 100 includes a plurality of probes 101 that are connectable to the input pads of the pad section 44, a signal generating section (signal generating means) 102 that generates various signals including inspection signals that are to be input to the first inspection wiring line 52 and second inspection wiring line 53 via the probes 101 and switching signals that are to be input to the first switching signal line 54A and second switching signal line 54B via the probes 101, and a signal input section (signal input means) 103 that inputs the inspection signals, which are generated by the signal generating section 102, to the associated first inspection wiring line 52 and second inspection wiring line 53, and the switching signals, which are generated by the signal generating section 102, to the associated first switching signal line 54A and second switching signal line 54B.

(Inspection Method)

An inspection method for a display device, which is applicable to the second embodiment, is as follows:

An inspection method for a display device that comprises:

an effective display section composed of a plurality of display pixels;

a first wiring line group that is disposed on one end side of a peripheral part, which is located on an outside of the effective display section, and that comprises wiring lines connected to odd-number-th scan lines, to which driving signals for turning on/off the display pixels on odd-number-th rows are supplied;

a second wiring line group that is disposed on the other end side of the peripheral part, and comprises wiring lines connected to even-number-th scan lines, to which driving signals for turning on/off the display pixels on even-number-th rows are supplied;

a first inspection wiring line that is connected to first wiring lines of the first wiring line group and to second wiring lines of the first wiring line group, which neighbor the first wiring lines; and a second inspection wiring line that is connected to third wiring lines of the second wiring line group and to fourth wiring lines of the second wiring line group, which neighbor the third wiring lines, the inspection method comprising:

inputting a first inspection signal to the first inspection wiring line and a second inspection signal to the second inspection wiring line at a timing when first switch elements, which are disposed between the first inspection wiring line and the first wiring lines, and third switch elements, which are disposed between the second inspection wiring line and the third wiring lines, are turned on the basis of input of a common first switching signal;

inputting the first inspection signal to the first inspection wiring line and the second inspection signal to the second inspection wiring line at a timing when second switch elements, which are disposed between the first inspection wiring line and the second wiring lines, and fourth switch elements, which are disposed between the second inspection wiring line and the fourth wiring lines, are turned on the basis of input of a common second switching signal; and inspecting, on the basis of the input of the first and second inspection signals, a wiring defect in the first wiring line group, the second wiring line group and the effective display section.

A description in greater detail will now be given of the inspection method for inspecting a wiring defect on the liquid crystal display panel in the liquid crystal display device having the above-described structure. The inspection method is executed in a process step after the formation of the liquid crystal display panel 1 and before the mounting of the driving IC chip 11 on the liquid crystal display panel 1. In the inspection device 100 that is applied to the inspection method, the signal generating section 102 generates independent two kinds of inspection signals, that is, the first inspection signal and second inspection signal, and two kinds of switching signals, that is, the first switching signal and second switching signal.

Specifically, in this inspection method, the probes 101 of the inspection device 100 are connected to the input pads of the pad section 44 of the liquid crystal display panel 1. At a predetermined timing, the signal input section 103 inputs the first switching signal, which is generated by the signal generating section 102, to the first switching signal line 54A. By the input of the first switching signal, the first switch elements 62A of the first scan line inspection section 42 and the third switch elements 63A of the second scan line inspection section 43 are turned on at proper timings. In addition, the signal input section 103 inputs the second switching signal, which is generated by the signal generating section 102, to the second switching signal line 54B. By the input of the second switching signal, the second switch elements 62B of the first scan line inspection section 42 and the fourth switch elements 63B of the second scan line inspection section 43 are turned on at proper timings. Further, the signal input section 103 inputs the switching signal, which is generated by the signal generating section 102, to the switching signal line 55. By the input of this switching signal, the switch elements 61 of the signal line inspection section 41 are turned on at proper timings.

Upon turning on of the first switch elements 62A, the signal input section 103 inputs the first inspection signal to the first inspection wiring line 52 that is connected to the first wiring lines 21 of the first wiring line group 20. Thereby, the first inspection signal is supplied to the odd-number-th scan lines that are connected to the first wiring lines 21. By the input of the first inspection signal, the switching elements 7 that are connected to the odd-number-th scan lines in the effective display section 6 are turned on at proper timings.

In addition, upon turning on of the third switch elements 63A, the signal input section 103 inputs the second inspection signal to the second inspection wiring line 53 that is connected to the third wiring lines 33 of the second wiring line group 30. Thereby, the second inspection signal is supplied to the even-number-th scan lines that are connected to the third wiring lines 33. By the input of the second inspection signal, the switching elements 7 that are connected to the even-number-th scan lines in the effective display section 6 are turned on at proper timings.

Subsequently, on the basis of the input of the first and second inspection signals, short-circuit between the first wiring line 21 and second wiring line 22 of the first wiring line group 20, short-circuit between the third wiring line 33 and fourth wiring line 34 of the second wiring line group 30, and short-circuit between the odd-number-th scan line and even-number-th scan line in the effective display section 6 are inspected. In this inspection step, the signal generating section 102 inputs the inspection video signals to the respective signal lines X via the signal line inspection wiring lines 51 (R, G, B) in the state in which the switching elements 7 in the effective display section 6 are turned on. Thereby, the inspection video signals are written in the display pixels PX in the effective display section 6 of the liquid crystal display panel 1. By the write of the inspection video signals, wiring defects of the various wiring lines on the liquid crystal display panel 1 are checked.

Specifically, as shown in FIG. 7, at a timing when signals can be input to the associated odd-number-th scan lines from the first wiring lines 21 of the first wiring line group 20, the first inspection signal is input from the first inspection wiring line 52 and the inspection video signals are input to the respective signal lines X. In this case, if short-circuit occurs between the neighboring first wiring line 21 and second wiring line 22 in the first wiring line group 20, for example, if short-circuit occurs between the wiring line W1 and wiring line W3, the first inspection signal is supplied not only to the scan line Y1, which is connected to the wiring line W1, but also to the scan line Y3, which is connected to the wiring line W3. Consequently, the switching elements 7 of the display pixels PX that are connected to the scan line Y3, as well as the switching elements 7 of the display pixels PX that are connected to the scan line Y1, are turned on at the same time. In a normal case, the switching elements 7 of the display pixels PX, which are connected to the scan lines Y1, Y5, Y9, . . . , are to be turned on. However, due to the short-circuit between the wiring lines W1 and W3, the switching elements 7 of the display pixels PX, which are connected to the scan lines Y1, Y3, Y5 and Y9, . . . , are turned on.

In this way, if the inspection video signals are supplied in the state in which the respective switching elements 7 are turned on, the associated display pixels PX on the liquid crystal display panel 1 are turned on.

By observing the turn-on states of the display pixels PX on the liquid crystal display panel 1, short-circuit between the first wiring line 21 and second wiring line 22 in the first wiring line group 20 can be checked.

Similarly, at a timing when signals can be input to the associated odd-number-th scan lines from the second wiring lines 22 of the first wiring line group 20, the first inspection signal is input from the first inspection wiring line 52 and the inspection signals are input to the respective signal lines X. Thereby, short-circuit between the first wiring line 21 and second wiring line 22 in the first wiring line group 20 can be checked.

In addition, as shown in FIG. 7, at a timing when signals can be input to the associated even-number-th scan lines from the third wiring lines 33 of the second wiring line group 30, the second inspection signal is input from the second inspection wiring line 53 and the inspection video signals are input to the respective signal lines X. In this case, if short-circuit occurs between the neighboring third wiring line 33 and fourth wiring line 34 in the second wiring line group 30, for example, if short-circuit occurs between the wiring line W2 and wiring line W4, the first inspection signal is supplied not only to the scan line Y2, which is connected to the wiring line W2, but also to the scan line Y4, which is connected to the wiring line W4. Consequently, the switching elements 7 of the display pixels PX that are connected to the scan line Y4, as well as the switching elements 7 of the display pixels PX that are connected to the scan line Y2, are turned on at the same time. In a normal case, the switching elements 7 of the display pixels PX, which are connected to the scan lines Y2, Y6, Y10, . . . , are to be turned on. However, due to the short-circuit between the wiring lines W2 and W4, the switching elements 7 of the display pixel PX, which are connected to the scan lines Y2, Y4, Y6 and Y10, . . . , are turned on. Thus, short-circuit between the third wiring line 33 and fourth wiring line 34 in the second wiring line group 30 can be checked.

Similarly, at a timing when signals can be input to the associated even-number-th scan lines from the fourth wiring lines 34 of the second wiring line group 30, the second inspection signal is input from the second inspection wiring line 53 and the inspection signals are input to the respective signal lines X. Thereby, short-circuit between the third wiring line 33 and fourth wiring line 34 in the second wiring line group 30 can be checked.

Besides, it is possible to inspect short-circuit between the odd-number-th scan line and the even-number-th scan line in the effective display section 6, at the same time as the inspection of short-circuit in the first wiring line group 20 and second wiring line group 30. Assume now that short-circuit occurs between the odd-number-th scan line and even-number-th scan line, for example, short-circuit occurs between the scan line Y1 and scan line Y2. In this case, if the first inspection signal is input from the first wiring line 21 to the associated odd-number-th scan line in the step of inspecting short-circuit between the first wiring line 21 and second wiring line 22 of the first wiring line group 20, the first inspection signal is supplied to the scan line Y1 and the scan line Y3. Consequently, the switching elements 7 of the display pixels PX that are connected to the scan line Y2, as well as the switching elements 7 of the display pixels PX that are connected to the scan line Y1, are turned on at the same time. In a normal case, the switching elements 7 of the display pixels PX, which are connected to the scan lines Y1, Y5, Y9, . . . , are to be turned on. However, due to the short-circuit between the scan line Y1 and scan line Y2, the switching elements 7 of the display pixels PX, which are connected to the scan lines Y1, Y2, Y5 and Y9, . . . , are turned on.

In this way, if the inspection video signals are supplied to the signal lines X in the state in which the respective switching elements 7 are turned on, the associated display pixels PX on the liquid crystal display panel 1 are turned on. By observing the turn-on states of the display pixels PX on the liquid crystal display panel 1, short-circuit between the neighboring scan lines can be checked.

Furthermore, according to the above-described inspection method, in addition to the inspection of short-circuit between wiring lines, it is also possible to inspect line breakage between the connection pad PD, which enables connection to the driving IC chip 11, and the terminal end of each wiring line, by observing the turn-on state of the display pixel PX on the liquid crystal display panel 1. Specifically, on the basis of the input of the various inspection signals, the turn-on state of the display pixels PX is observed. Thereby, it is possible to inspect line breakage between the first wiring line 21 and second wiring line 22 of the first wiring line group 20, line breakage between the third wiring line 33 and fourth wiring line 34 of the second wiring line group 30, and line breakage occurring at a point over the length to the terminal ends of the scan lines Y and signal lines X in the effective display section 6 (if line breakage occurs, the associated display pixel PX is not turned on).

As has been described above, according to the inspection method, in the liquid crystal display device with such a layout that driving signals can be supplied to the odd-number-th scan lines and even-number-th scan lines from both end sides of the effective display section, the inspection device inputs the first inspection signal to the mutually neighboring first wiring lines and second wiring lines of the first wiring line group at different timings. Based on the input of the inspection signal, it is possible to exactly detect a wiring defect in the first wiring line group. In addition, the inspection device inputs the second inspection signal to the mutually neighboring third wiring lines and fourth wiring lines of the second wiring line group at different timings. Based on the input of the inspection signal, it is possible to exactly detect a wiring defect in the second wiring line group. At the same time, it is possible to exactly detect wiring defects such as short-circuit between the odd-number-th scan line and even-number-th scan line in the effective display section, and line breakage of the scan line and the signal line. Thus, it is possible to prevent a liquid crystal display panel with a wiring defect from going to a subsequent fabrication step, and to suppress a decrease in manufacturing yield.

The present invention is not limited to the above-described embodiments. In practice, the structural elements can be modified without departing from the spirit of the invention. Various inventions can be made by properly combining the structural elements disclosed in the embodiments. For example, some structural elements may be omitted from all the structural elements disclosed in the embodiments. Furthermore, structural elements in different embodiments may properly be combined.

The display device of the present invention is not limited to the above-described liquid crystal display device. The invention is applicable to various display devices with such a layout that a first wiring line group and a second wiring line group are provided, respectively, on both end sides of the effective display section. For instance, the invention is applicable to an organic electroluminescence display device including self-luminous elements as display elements.

In the above-described embodiments, the first inspection signal and second inspection signal may be different signals or may be the same signal. In addition, at least one of the first inspection signal and second inspection signal may be an inspection signal that is constantly in an OFF level during the inspection step.

What is claimed is:

1. A display device comprising:

an effective display section composed of a plurality of display pixels;

a first wiring line group that is disposed on one end side of a peripheral part, which is located on an outside of the effective display section, and that comprises wiring lines connected to odd-number-th scan lines, to which driving signals for turning on/off the display pixels on odd-number-th rows are supplied;

a second wiring line group that is disposed on the other end side of the peripheral part, and comprises wiring lines connected to even-number-th scan lines, to which driving signals for turning on/off the display pixels on even-number-th rows are supplied;

a first inspection wiring line that is connected to first wiring lines of the first wiring line group and to third wiring lines of the second wiring line group; and a second inspection wiring line that is connected to second wiring lines of the first wiring line group, which neighbor the first wiring lines, and to fourth wiring lines of the second wiring line group, which neighbor the third wiring lines.

2. The display device according to claim 1, wherein one end portion of each of the first inspection wiring line and the second inspection wiring line is provided with an input pad that enables input of a driving signal.

3. The display device according to claim 1, wherein the effective display section is provided on a liquid crystal display panel in which a liquid crystal layer is interposed between an array substrate and a counter-substrate.

4. The display device according to claim 3, wherein the first inspection wiring line and the second inspection wiring line are disposed on an extension part of the array substrate, which extends outward beyond an end portion of the counter-substrate.

5. The display device according to claim 4, further comprising a driving IC chip that is disposed at a position corresponding to an area where the first inspection wiring line and the second inspection wiring line are disposed.

6. The display device according to claim 5, wherein the driving IC chip includes a first driving unit that supplies the driving signals to the odd-number-th scan lines, a second driving unit that supplies the driving signals to the even-number-th scan lines, and a signal line driving section that is sandwiched between the first driving unit and the second driving unit.

7. A display device comprising:

an effective display section composed of a plurality of display pixels;

a first wiring line group that is disposed on one end side of a peripheral part, which is located on an outside of the effective display section, and that comprises wiring lines connected to odd-number-th scan lines, to which driving signals for turning on/off the display pixels on odd-number-th rows are supplied;

a second wiring line group that is disposed on the other end side of the peripheral part, and comprises wiring lines connected to even-number-th scan lines, to which driving signals for turning on/off the display pixels on even-number-th rows are supplied;

a first inspection wiring line that is connected to first wiring lines of the first wiring line group and to second wiring lines of the first wiring line group, which neighbor the first wiring lines;

a second inspection wiring line that is connected to third wiring lines of the second wiring line group and to fourth wiring lines of the second wiring line group, which neighbor the third wiring lines;

a first switching signal line that is supplied with a switching signal for ON/OFF controlling first switch elements, which are disposed between the first inspection wiring line and the first wiring lines, and third switch elements, which are disposed between the second inspection wiring line and the third wiring lines; and a second switching signal line that is supplied with a switching signal for ON/OFF controlling second switch elements, which are disposed between the first inspection wiring line and the second wiring lines, and fourth switch elements, which are disposed between the second inspection wiring line and the fourth wiring lines.

8. The display device according to claim 7, wherein one end portion of each of the first inspection wiring line, the second inspection wiring line, the first switching signal line and the second switching signal line is provided with an input pad that enables input of a driving signal.

9. The display device according to claim 7, wherein the effective display section is provided on a liquid crystal display panel in which a liquid crystal layer is interposed between an array substrate and a counter-substrate.

10. The display device according to claim 9, wherein the first inspection wiring line and the second inspection wiring line are disposed on an extension part of the array substrate, which extends outward beyond an end portion of the counter-substrate.

11. The display device according to claim 10, further comprising a driving IC chip that is disposed at a position corresponding to an area where the first inspection wiring line and the second inspection wiring line are disposed.

12. The display device according to claim 11, wherein the driving IC chip includes a first driving unit that supplies the driving signals to the odd-number-th scan lines, a second driving unit that supplies the driving signals to the even-number-th scan lines, and a signal line driving section that is sandwiched between the first driving unit and the second driving unit.

* * * * *